United States Patent [19]

Bonham et al.

[11] 3,775,113

[45] Nov. 27, 1973

[54] POSITIVE IMAGE TRANSFER

[75] Inventors: James A. Bonham; Panayotis C. Petrellis, both of Saint Paul, Minn.

[73] Assignee: Minnesota Mining and Manufacturing Company, St. Paul, Minn.

[22] Filed: Feb. 9, 1972

[21] Appl. No.: 224,950

[52] U.S. Cl. .................................... 96/28, 96/35.1
[51] Int. Cl. .......................................... G03c 11/12
[58] Field of Search .................... 96/28, 115 R, 35.1

[56] References Cited

UNITED STATES PATENTS 3,395,014 7/1968 Cohen et al. .......................... 96/28
3,536,489 10/1970 Smith ............................... 96/115 P

*Primary Examiner*—Norman G. Torchin
*Assistant Examiner*—John L. Goodrow
*Attorney*—Alexander, Sell, Steldt & Delahunt

[57] ABSTRACT

A process for transferring positive images of an original to receptor surfaces is provided. The process utilizes a transfer sheet comprising a flexible, dimensionally stable film support bearing a thermoplastic photosolubilizable layer which, after imagewise exposure and development to remove exposed areas, may be applied to a receptor surface to transfer a positive image of the original to the receptor.

9 Claims, No Drawings

POSITIVE IMAGE TRANSFER

FIELD OF THE INVENTION

This invention relates to processes for the transfer of positive images utilizing transfer sheets comprising a flexible, dimensionally stable support film bearing a thermoplastic light-sensitive layer.

BACKGROUND OF THE INVENTION

Processes for the preparation and transfer of images to receptor surfaces are generally known in the art. These processes utilize a transfer sheet comprising a support film bearing a photosensitive layer. This photosensitive layer is generally a photopolymerizable or photocrosslinkable composition which polymerizes or crosslinks in areas exposed to actinic radiation. Using physical tackification techniques, such as moistening the layer with a solvent, or heating the layer, the unexposed image areas tackify and are rendered transferable when contacted to a suitable receptor while the exposed image areas remain non-tacky and thereby nontransferable. Upon contacting a receptor, the support film is then separated from the receptor surface leaving the unexposed areas of the photosensitive layer on the receptor while the exposed areas are retained on the initial transfer sheet.

Processes utilizing a transfer sheet wherein the photosensitive layer is a photopolymerizable composition are disclosed in Burg & Cohen, U.S. Pat. Nos. 3,060,023–025; Heirt, U.S. Pat. No. 3,060,026; and Seide, U.S. Pat. 3,376,136.

The processes of the foregoing patents, however, have distinct disadvantages. Because transfer occurs by a relative degree of tackification between exposed and unexposed areas, support sheets must be carefully chosen such that the exposed areas preferentially adhere to the support sheet while the unexposed areas preferentially adhere to the receptor. Selection of proper support sheet material can thus be critical to these processes for image transfer.

Additionally, since the imaged photosensitive layer is contacted with a receptor as an integral layer, resolution of the transferred images is limited. Physical separation at the line of demarcation between the unexposed tacky areas and the exposed non-tacky areas is difficult, resulting in limited resolution of transferred images.

Furthermore, since no image development is undertaken prior to image transfer utilizing these techniques, the capability of the user to compose images on a receptor sheet from separate transfer sheets or to add on to an existing image is minimal. If the unexposed areas are initially tacky, premature sticking may occur and if heavily pigmented, visual registration is nearly impossible.

Additionally, the use of a concentration of colors in the photopolymer composition sufficient to produce a desirably deep color can interfere with the photopolymerization reaction and prolong exposure time to an impractical extent. To circumvent this problem, it has been proposed to dust an uncolored transferred image with a finely divided colored powder. This technique, although increasing the color density of the image, is unsatisfactory because it required additional materials and equipment and, furthermore, is messy.

A further objection to processes utilizing transfer sheets having a free radical photopolymerizable layer is that such layers are susceptible to oxygen inhibition and must be protected by a cover sheet or protective layer.

This invention provides a new and improved process for transferring densely colored images with excellent resolution utilizing a transfer sheet comprising a thermoplastic photosolubilizable layer on a suitable support film. Upon imagewise exposure of the photosolubilizable layer to actinic radiation and development whereby exposed areas are removed, the image is transferred to a receptor surface.

SUMMARY OF THE INVENTION

In accordance with the invention, there is provided a method of transferring an image to any suitable receptor, comprising:

1. exposing a transfer sheet to actinic radiation in an imagewise pattern through an original, the transfer sheet comprising a flexible, dimensionally stable, impermeable carrier sheet bearing a thermoplastic photosolubilizable layer on one surface thereof,
2. removing the exposed areas of the photosolubilizable layer from the carrier sheet whereby a positive image of the original is obtained on the carrier sheet;
3. transferring the positive image of the original to a receptor.

In this manner, dry positive images can be transferred to engineering drafting drawings, printing plates, colored visuals, transparencies and decorative designs. The process is especially useful to compose or add on to images, e.g., to make multi-colored images.

DETAILED DESCRIPTION OF THE INVENTION

Thermoplastic photosolubilizable compositions useful in this invention are those which become solubilized in areas exposed to actinic radiation whereas unexposed areas remain, by comparison, insoluble. The exposed areas can thus be removed by developing solutions while the unexposed areas remain intact. Thus, imagewise exposure of a photosolubilizable composition through an original, followed by developing, yields an image corresponding to the original in terms of contrast, i.e. yields a positive image.

Examples of such photosolubilizable compositions include the quinone diazide-containing compositions which become alkaline solvent-soluble on exposure to light, e.g., compositions containing quinone diazide sulfonic acid esters of polyhydric arylene compounds as disclosed in U.S. Pat. No. 3,406,118, 3,406,119, 3,406,121, 3,106,465, and others; the quinone diazide sulfonic acid amides as disclosed in U.S. Pat. No. 3,406,111, 3,046,122–124, and others; the quinone diazide aryl sulfones disclosed in U.S. Pat. No. 3,046,112; the hydrazine derivatives of quinone diazide sulfonic acids disclosed in U.S. Pat. No. 2,766,118; the azole amides of quinone diazide sulfonic acids disclosed in U.S. Pat. No. 2,907,655; and the quinoline quinone diazides disclosed in U.S. Pat. No. 2,859,112. Other compositions useful in the invention, which are rendered alkaline soluble on exposure to light, include compositions containing imino quinone diazides as disclosed in U.S. Pat. No. 2,759,817; diazonium compounds such as disclosed in U.S. Pat. Nos. 2,667,415, 2,804,388, 2,937,085, 2,729,562, 3,219,447, and others, azidoarylamidazoles disclosed in U.S. Pat. No. 3,061,435; diazo resins such as disclosed in U.S. Pat.

Nos. 3,136,636, 3,085,008, and 3,199,981; azide polymers such as disclosed in U.S. Pat. Nos. 3,174,860, 3,230,087, and 3,100,702.

A preferred class of suitable photosolubilizable compositions are those disclosed in assignee's copending U.S. application Ser. No. 224,918 incorporated herein by reference. The photosensitive compositions disclosed therein are comprised of a photolyzable acid progenitor and water-insoluble organic compounds containing groups which are degradable in acidic environments. Upon exposure of the composition to actinic light, the acid progenitor photlyzes to generate an acidic condition which in turn catalyzes the degradation of the acid-degradable groups such that the exposed areas become solubilized relative to the unexposed areas.

The preferred compounds containing acid-degradable groups are in general prepared by the nucleophilic addition reaction of organic compounds containing one or more alkyl vinyl ether groups with organic compounds containing one or more aromatic hydroxyl groups, aromatic monoalkylsulfanomide groups, i.e. —$RNHSO_2Ar$ where R is a lower alkyl group and Ar is a monovalent or divalent aromatic group, or the secondary aromatic amines phenothiazine or α-naphthylphenylamine. These compounds can be nonpolymeric or polymeric, and where polymeric, the acid-degradable groups can be within or pendent to the polymeric backbone. The acid-degradable groups within the addition reaction product can be generally depicted by the formula

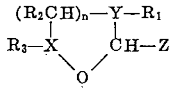

where *n* is zero, 1, 2, or 3. When *n* is zero, X and Y are —$CH_2$— and $R_1$ is hydrogen or lower alkyl; when *n* is 1, 2, or 3, X and Y are —CH—, $R_1$ is hydrogen, and $R_2$ is hydrogen or lower alkyl. $R_3$ is hydrogen, a monovalent aliphatic radical, or a divalent organic radical, and Z is selected from the group consisting of —OAr, —$NRSO_2Ar$,

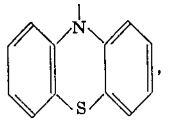

and

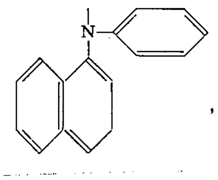

where Ar is a monovalent or divalent aromatic group and R is a lower alkyl group. (Lower alkyl in all cases signifies no more than about four carbon atoms which can be branched or unbranched).

When $R_3$ is a divalent organic radical, it serves to link one acid-degradable group to another. Ether, ester, urethane, amide, non-basic amino, and urea linkages are typical of such divalent organic radicals.

An example of a nonpolymeric compound containing acid-degradable groups falling within the above formula is

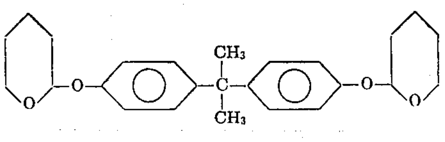

which is bis-2-tetrahydropyranylether of 4,4′ isopropylidene diphenol.

Where heat is utilized to transfer the developed image, the photosolubilizable compositions should preferably have a stick or transfer temperature between about 40° C. and about 150° C. Too high a stick temperature may cause the flexible carrier sheet to begin to warp or the composition may begin to flow and thus image distortion or decreased image resolution may result. This stick temperature is generally governed by the particular photosolubilizable composition utilized and by desirable film-forming polymeric binders incorporated therein.

In some instances, the photosolubilizable composition itself will have adequate film-forming capability and thermoplasticity, especially where the composition is polymeric. When desired, however, thermoplastic film-forming polymeric binders can be included. Examples of suitable polymeric materials include polyvinylchloride and polyvinylacetals, e.g., polyvinylformal and polyvinylbutyral.

A preferred class of thermoplastic film-forming polymeric binders are the novolac phenol-aldehyde condensation polymers such as are disclosed in U.S. Pat. No. 3,514,288.

Generally, one part by weight of photosolubilizable material may be used with up to about 9 parts or more by weight of polymeric binder. When the photosolubilizable material itself is polymeric, weight ratios of photosolubilizable material to polymeric binder of 1:0 to about 1:0.5 are preferred. When the photosolubilizable material is not polymeric, the preferred ratio of photosolubilizable material to binder is in the range of about 1:4 to about 1:8.

In addition to photosolubilizable materials, and where desirable a film-forming thermoplastic polymeric binder, the light-sensitive layer may contain minor amounts, i.e., less than about 10 percent, of other components to impart certain desirable characteristics to the elements used in the process of the invention, e.g., to improve adhesion of the photosolubilizable composition to the carrier sheet, adhesion to the receptor surface on transfer, abrasion resistance, chemical inertness, etc. Thus, if desired, the light-sensitive layer may contain non-thermoplastic polymeric materials including polyvinylalcohol, cellulose, particulate phenolic resins, and the like. Polymeric materials such as polyvinyl chloride and polyvinyl ethers can be included to plasticize the thermoplastic light-sensitive layer. Inorganic materials which are essentially transparent to actinic radiation at the wavelengths used for exposure of the photosensitive element may be added to improve internal strength of the composition, reduce tack, and improve abrasion resistance. Examples of such materials include glass microspheres and microbubbles, powdered glass, sand, clays, collidal carbon and the like.

Various dyes, pigments, and color-forming components may be added to the thermoplastic photosolubilizable composition. Generally, these components can be present in concentrations of up to about 20 weight percent, thus enabling the production of densely colored images.

The photosolubilizable compositions can in general be prepared by mixing the components in a suitable solvent. When insoluble pigments or other insoluble particulate materials are among the components utilized in the composition, conventional techniques such as ball-milling will generally be required.

Suitable solvents for the preparation of the thermoplastic photosolubilizable composition include hydrocarbon solvents, for example, benzene, toluene, etc.; ketones, such as acetone, methylethylketone, methylisobutylketone; chlorinated hydrocarbons, such as methylene chloride, ethylene chloride, etc.; and the like. Application concentrations of the thermoplastic composition are generally about 10 to about 40 percent solids content and preferably about 20 to about 35 percent solids content. Generally, concentration will be limited by the application equipment available to the user. For example, higher concentrations will require smaller coating orifices and closer tolerances, etc.

The photosensitive transfer sheet utilized in the invention can generally be prepared by coating solutions or dispersions of the thermoplastic photosolubilizable composition on a suitable support or carrier sheet in any well known manner, such as by extrusion, dip coating, knife coating, etc.

To effect efficient transfer of the image to a receptor, preferred coating weights of the photosolubilizable material on the carrier sheet are in the range of 100 to 1,000 milligrams per square foot. Extremely low coating weights may result in tearing of the image on transfer while exceedingly high coating weights may result in image spreading upon thermal transfer and may also result in a brittle coating.

The carrier sheet or support useful in the process of the invention must be flexible, smooth, impermeable (i.e., it is non-porous and is not penetrated, by, or permeable to, water or other liquids or developing agents) and dimensionally stable, and is preferably transparent. Examples of suitable supports include films of polyester, such as polyethylene terephthalate; polyamides such as hexamethylene-diamine adipamide; polyolefins; vinyl polymers such as polyvinylchloride, and polyethylene-coated paper and glassine.

Support films of polyester can be untreated film, corona discharged film, primed film, or photographic subbed polyester (gelatin/acrylate mixture subbing). To improve release from the photosolubilizable layer, a polyester support can be treated with, for example, silicones, waxes, or polyvinylalcohol which is top coated with a water-insensitive resin to prevent developing solutions from attacking the polyvinyl alcohol.

In the practice of this invention, the photosolubilzable sheet material is typically exposed through the carrier or support material (when a transparent support is utilized) to actinic light through a positive original for a sufficient period of time to effect the solubilization of the exposed areas of the photosolubilizable composition. The exposed element is then developed with a suitable developing solution using mild abrasion with a soft swab pad or sponge to accelerate the removal of the exposed areas. Swabbing for about 30 seconds to about 5 minutes is generally sufficient to remove the image-exposed solubilized areas of the photosensitive element. The element is wiped clean, dried, and then transferred to a receptor by placing the imaged and developed photosolubilizable layer of the sheet material against the receptor and in contact therewith. If the receptor itself is tacky, heat is not required to transfer the image. If the receptor is non-tacky, heat can be applied to the sheet material by means of a heated roller, heated stylus, heat blanket, or equivalent apparatus, to the preferred transfer temperature range of about 40° C. to about 150° C. Sufficient pressure is required to insure a complete contact of the image to be transferred with the receptor surface. Upon cooling, the support film or carrier sheet is peeled from the image which now adheres to the receptor surface. This removal of the carrier sheet is considered to be an integral part of the transfer. In this manner, images may be prepared and transferred to drafting films, drawings, printing plates, colored visuals, projections transparencies, and the like. Lettering and wording such as name plates and images may be prepared and transferred to wood, plastic, reflective material, ceramic, and metal surfaces and apparatus. Because the image is developed prior to transfer, the system can be used to compose, e.g. as an add on to receptors which contain an image.

Composite images can be sequentially transferred to a single receptor from individual transfer sheets, e.g., by overlaying the transfer sheet in registration with a receptor containing a previously transferred image. Separation originals which when combined yield the desired composite image can be used to image each transfer sheet as desired. Additionally, in this manner, multi-colored images can be produced. The individual transfer sheets can be placed in registration prior to transfer to the receptor to provide a proof of the final multi-colored image.

The invention will be further illustrated, but is not intended to be limited by, the following detailed examples, wherein all parts, unless otherwise stated, are by weight.

EXAMPLE I

A photosensitive composition is prepared by sand milling a mixture of:

265 parts of "Alnovol 429K," a cresol-formaldehyde novolac condensation resin available from the American Hoescht Co.

13.2 parts of carbon black, "Cabot Regal Black (300R)" available from Cabot Corporation (other color pigments can be utilized according to need)

2 parts of "Formvar 7/70," a polyvinylformal resin available from the Monsanto Chemical Co.

550 parts of methylethylketone

To this mixture is added:

33 parts bis-2-tetrahydropyranyl ether of 4,4'-isopropylidene diphenol 4 parts 2,4-bis(trichloromethyl)-6-(4-methoxy styryl)-s-triazine The resulting mixture is thoroughly stirred and coated at a wet thickness of 2-3 mils onto a 2 mil polyester film which has been treated by coating a layer of polyvinyl alcohol (15–25 mg./sq./ft.) and then a layer of "Formvar 15/95 S," a polyvinyl formal resin available from the Monsanto Chemical Co., (15–25 mg./sq. ft.) which protects the polyvinyl alcohol layer from the aqueous developer. The coated transfer sheet is oven dried at 70°–90° C., providing a dry coating weight of 650–750 mg./sq. ft.

The dried photosensitive system is cut to a desired size and exposed through a positive transparency to the light of a pulse Xenon (NuArc Co. Model FT26LNS) for 60 seconds. The exposed element is then developed by gently rubbing with a pad, using as developer a one percent aqueous sodium hydroxide solution to which has been added as a surfactant 0.1–0.5 percent Dowfax 2A, available from the Dow Chemical Co.

The development time ranges from 30–180 seconds. Upon development the light exposed areas are removed leaving the film support bearing a positive image with a clean background.

The image surface is brought in contact with an engineering drawing designed on drafting film base, and by briefly heating at 80°–110° C. and with slight pressure applied, the image is transferred as an add on to the engineering drawing. The resulting engineering drawing is then passed through a conventional diazo machine and a very good blue line copy is obtained with no detrimental effects to the transferred image.

Similarly, using the above procedure, the transferred image can be used as an add on or as a means of correcting a printing plate.

EXAMPLE II

A photosensitive composition is prepared by ball milling for four days a mixture of:

175 parts methylisobutylketone
55.5 parts "Alnovol 429K," from Example I
9.2 parts "Monastral Blue BT 284D" pigment, available from the E. I. duPont Company, and adding to this mixture:

210 parts methylisobutylketone
15 parts bis-2-tetrahydropyranyl ether of 4,4'-isopropylidene diphenol
6 parts 2,4-bis(trichloromethyl)-6-(4-methoxystyryl)-s-triazine, and
5 parts "Gantrex M-555," a 50 percent solution of polymethylvinyl ether in toluene, available from the General Analine and Film Company The resulting mixture is thoroughly stirred and coated at a wet thickness of about 3 mils onto 2 mil polyester film, providing a dry coating weight of 750 mg/sq. ft. The element is exposed and developed according to the method of Example I.

By pressing the image surface of the developed transfer sheet against a given receptor surface and briefly heating at 80° to 110° C., the image is transferred to the receptor surface. Glossy positive images having excellent resolution on a clean background are obtained. Drafting film, metal, paper, plastic, etc. have been successfully used as receptor surfaces.

Utilizing in place of "Monastral Blue BT 284D," other pigments such as "Watchung Red RT 698," "Medium Lithosol Fast Yellow Y," (all available from the E. I. duPont Company), Carbon Black ("Cabot Regal 300" from Example I), etc., variously colored positive images are obtained on the receptor surfaces.

EXAMPLE III

Repeating Example II with the blue, red, yellow, and black pigments indicated, four transfer sheets are obtained. Upon exposure of these sheets to corresponding separation positive originals and developing, a four sheet colored overlay proofing system is obtained.

The colored separation positive overlay sheets can then be used to construct a four color, single sheet proof by sequential image transfers. For example, the cyan image is contacted to a "3M Brand Scotchprint" coated film, (available from Minnesota Mining and Manufacturing Co.) and passed through a heated roller unit (duPont CTF 2400) at 80°–100° C. at a speed of 1 foot/minute. The support film is peeled off leaving the cyan image on the receptor. Using this same technique the yellow separation image is then transferred in registration with the cyan imaged receptor. This is followed by the magenta and black separation images to yield a full color single sheet copy of the original.

EXAMPLE IV

A thermoplastic photosolubilizable composition is prepared by thoroughly mixing 100 parts methylisobutylketone
50 parts "Alnovol 429K" of Example 1
15 parts bis-2-tetrahydropyranyl ether of 4,4'-isopropylidene diphenol
2.5 parts 2,4-bis (trichloromethyl)-6-(4-methoxystyryl)-s-triazine,
250 parts of a 5 percent solution in methylethylketone of "Holland-Suco Vinyl Chip" PhthaloBlue VYPB–7413(2193) pigment available from the Chemetron Corporation.

The mixture is coated at a wet thickness of about 3 mils onto 3 mil polyester film, providing a dry coating weight of 750 mg./sq. ft., dried, and cut to desired size. Samples exposed through a positive transparency to a carbon arc light source (available from Douthitt Corporation) for 20 seconds, are developed in one percent aqueous sodium hydroxide, blotted dry, and transferred to a receptor surface by pressing the image surface against the receptor and heating briefly at 80° to 110° C. Glossy blue images having excellent resolution on a clean background are obtained on the receptor.

By using in place of the "Phthalo-Blue" other vinyl chip pigments such as "Holland-Suco Vinyl Chip" Flavanthrone Yellow Granules-VYPY–7385(2448), Perylene Red Medium Granules-VYPR–7006(2373), and Carbon Black-Jet Granules -UYPK–7301(2473), similar transfer sheets having similar transfer properties are obtained that are correspondingly colored yellow, red, and black.

EXAMPLE V

A thermoplastic photosolubilizable composition is prepared by mixing 100 parts methylisobutylketone
50 parts "Alnovol 429K" of Example I
25 parts 1,2-naphthoquinone diazide-5-tert-butylphenyl sulfonate
250 parts of the blue pigment solution of EXAMPLE II.

The photosensitive composition is coated at a wet thickness of about 3 mils on 2 mil polyester film, providing a dry coating weight of 650 mgs./sq. ft. Exposure through a positive transparency to the light source of Example I for 60 seconds, followed by developing with a one percent aqueous solution of sodium hydroxide yields a developed transfer sheet. Utilizing the transfer conditions and receptors of Examples I and II, similar results are obtained.

What is claimed is:

1. A process for the transfer of a positive image to a receptor comprising the steps of:

a. exposing a transfer sheet to actinic radiation in an imagewise pattern through an original, said transfer sheet comprising i. a flexible dimensionally stable, impermeable carrier sheet, and ii. overlying and in direct contact with one surface of said carrier sheet, a thermo-plastic photosolubilizable layer;

b. removing exposed areas of said photosolubilizable layer from said carrier sheet, whereby a positive image of said original remains on said carrier sheet;

c. transferring said positive image of said original to a receptor.

2. The process of claim 1 wherein said positive image of said original is transferred to said receptor by means of heat and pressure.

3. The process of claim 1 wherein said photosolubilizable composition comprises a. a water-insoluble organic compound containing one or more acid-degradable groups, the group having the formula

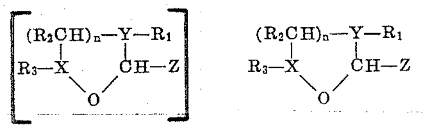

where $n$ is zero, 1, 2 or 3; wherein when $n$ is zero, X and Y are —$CH_2$— and $R_1$ is hydrogen or lower alkyl; and when $n$ is 1, 2, or 3, X and Y are —CH—, $R_1$ is hydrogen, and $R_2$ is hydrogen or lower alkyl; and wherein $R_3$ is hydrogen, a monovalent aliphatic radical, or a divalent organic radical; and Z is selected from the group consisting of —OAr, —$NRSO_2Ar$,

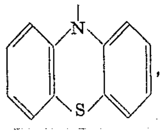

and

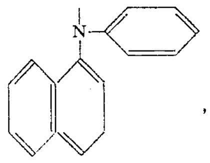

where R is a lower alkyl group and Ar is a monovalent or divalent aromatic group; and b. a photoinitiator comprising a photolyzable acid progenitor which is normally nonreactive but which, upon absorption of actinic radiation, is capable of generating an acidic condition.

4. The process of claim 1 wherein said flexible carrier sheet is untreated polyester.

5. The process of claim 4 wherein said untreated polyester is polyethylene terephthalate.

6. The process of claim 1 wherein said carrier sheet is treated polyester.

7. The process of claim 1 wherein said receptor contains an image.

8. A process for the sequential transfer of a composite image to a single receptor comprising the steps of a. exposing a transfer sheet to actinic radiation in an imagewise pattern through a separation positive original, said transfer sheet comprising i. a flexible, dimensionally stable, impermeable carrier, and ii. overlying and in direct contact with one surface of said carrier sheet a thermoplastic photosolubilizable layer, b. removing exposed areas of said photosolubilizable layer from said carrier sheet whereby a positive image of said separation original remains on said carrier sheet;

c. transferring said positive image of said separation original to said receptor, d. repeating steps (a) through (c), transferring said positive image in registration with the imaged receptor until said composite image is formed.

9. The process of claim 8 wherein said positive image of said separation positive original is transferred to said receptor by means of heat and pressure.

* * * * *

UNITED STATES PATENT OFFICE
CERTIFICATE OF CORRECTION

Patent No. 3,775,113 Dated December 18, 1973

Inventor(s) James A. Bonham & Panayotis C. Petrellis

It is certified that error appears in the above-identified patent and that said Letters Patent are hereby corrected as shown below:

The structural formula in claim 3, line 30, col. 9

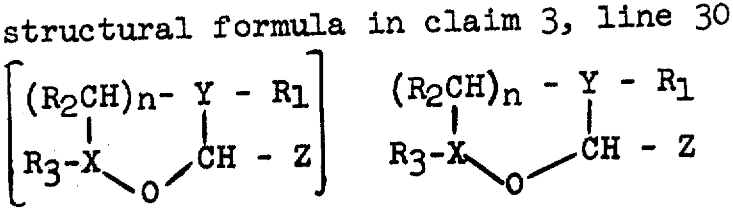

should be depicted

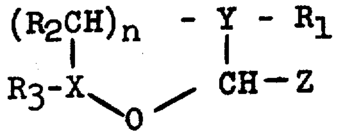

The structural formula at column 10, line 5,

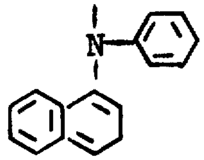

should be depicted

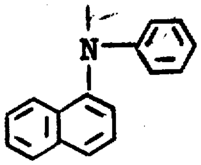

Signed and sealed this 30th day of July 1974.

(SEAL)
Attest:

McCOY M. GIBSON, JR.
Attesting Officer

C. MARSHALL DANN
Commissioner of Patents